United States Patent [19]

Korver

[11] 4,131,807

[45] Dec. 26, 1978

[54] SAWTOOTH GENERATOR

[75] Inventor: Jan A. C. Korver, Eindhoven, Netherlands

[73] Assignee: U.S. Philips Corporation, New York, N.Y.

[21] Appl. No.: 797,674

[22] Filed: May 17, 1977

[30] Foreign Application Priority Data

May 20, 1976 [NL] Netherlands ............... 7605373

[51] Int. Cl.$^2$ ............................................. H03K 4/56
[52] U.S. Cl. ............................. 307/228; 328/185; 331/111
[58] Field of Search ............... 331/111; 307/228; 328/185, 184

[56] References Cited

U.S. PATENT DOCUMENTS

| 3,273,007 | 9/1966 | Schneider | 307/228 X |
| 3,373,377 | 3/1968 | Townsend | 307/228 X |
| 3,569,735 | 3/1971 | Lavender | 307/228 |
| 3,577,007 | 5/1971 | Cross | 307/228 |
| 3,982,139 | 9/1976 | Troy | 307/228 |
| 4,071,776 | 1/1978 | Isham | 307/228 |

Primary Examiner—John S. Heyman
Attorney, Agent, or Firm—Thomas A. Briody; William J. Streeter; Henry I. Steckler

[57] ABSTRACT

A sawtooth generator for producing a sawtooth voltage of constant amplitude, comprising a transistor having, in the emitter lead, a resistor in series with a capacitor, a switch being in parallel with this capacitor. A second capacitor is included between the base and the junction point of the resistor and said first capacitor. A high-value resistor is connected between a d.c. voltage source and the base. The generator can also be made self-oscillating.

13 Claims, 4 Drawing Figures

SAWTOOTH GENERATOR

The invention relates to a circuit for generating a sawtooth voltage across a first capacitor which is periodically charged by a charging current, comprising an amplifying element having an input electrode and a first and a second output electrode, a resistor a connection of which is connected to the first output electrode of the amplifying element and the other connection to the first capacitor one end of which is connected to a first terminal of an power supply source, while the second output electrode of the amplifying element is connected to the second terminal of the power supply source, furthermore comprising a second capacitor which is included between the input electrode of the amplifying element and the junction of the first capacitor and the resistor and a switch which is in parallel with the first capacitor for periodically discharging this capacitor.

Figures 1, 2:
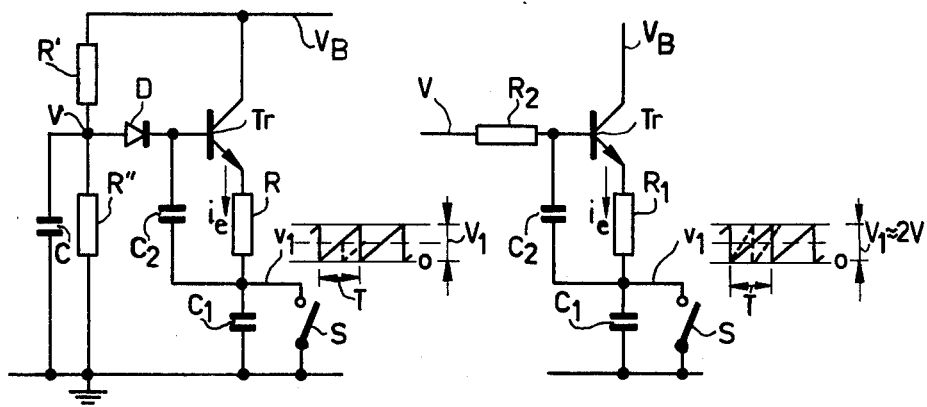

Such a sawtooth generator is known from United Kingdom Patent Specification 924,224 and is shown in FIG. 1. Herein Tr represents an npn-transistor whose collector is connected to the positive terminal of the power supply source $V_B$ and the emitter to the resistor R. $C_1$ and $C_2$ respectively represent the first and the second capacitor respectively whereas S is the switch. The connection of capacitor $C_2$ which is not connected to resistor R and to capacitor $C_1$ as well as the cathode of a diode D are connected to the base of transistor Tr. The anode of diode D is connected to the positive terminal of a d.c. voltage source V. The negative terminal of both sources $V_B$ and V as well as the connection of capacitor $C_1$ not connected to resistor R and switch S respectively are connected to chassis. Source V is derived from source $V_B$ by means of two resistors R', R" connected in series between terminals thereof and a decoupling capacitor C.

Capacitor $C_1$ is periodically charged by the emitter current $i_e$ of transistor Tr and it is discharged by switch S. At the beginning of the charging process, that is to say at the instant at which switch S is opened diode D is rendered non-conducting by feedback through capacitor $C_2$ which has a large capacitance. Across resistor R there is a voltage which is approximately constant so that current $i_e$ is substantially constant. The voltage $v_1$ across capacitor $C_1$ increases from zero linearly versus the time. The portion of current $i_e$ which flows to capacitor $C_2$ and the base of transistor Tr is neglected. At the end of the charging process, i.e. at the instant at which switch S is closed, voltage $v_2$ assumes its maximum value $V_1$. If the charging time is indicated by T and if $C_1$ also indicates the capacitance of capacitor $C_1$ then is holds that $i_e T = C_1 V_1$ wherein $i_e = V_2/R$. Herein $V_2$ is the voltage across capacitor $C_2$ which is assumed to be constant whereas the base-emitter voltage $v_{be}$ of transistor Tr has been neglected with respect to $V_2$.

The foregoing shows that $$V_1 = V_2 T/RC_1 = V_2/RC_1 \cdot 1/f,$$

wherein $f = 1/T$ is the frequency of the signal which operates switch S, the duration of the discharging process being assumed to be very short relative to time T. So in the prior art circuit of FIG. 1 firstly the charging current of the first capacitor and consequently the steepness of the sawtooth is constant and secondly the amplitude of the sawtooth voltage obtained is inversely proportional to the frequency. If, for example, the synchronizing frequency of switch S is twice as high then the amplitude of the sawtooth is twice as low. No requirement is imposed on the value of resistor R.

It is an object of the invention to modify the discussed, simple circuit in such a way that the amplitude of the generated sawtooth voltage remains substantially constant and is especially substantially independent of the frequency while retaining the proper linearity of the original circuit. Such a sawtooth generator is important in the television technology for the field deflection (that is to say into the vertical direction with the frequency 50 or 60 Hz respectively). As the average value of the sawtooth generated hereby is in the synchronized state substantially equal to that in the non-synchronized state, a smaller instability takes place then would otherwise be the case. Such an instability is described in U.S. Pat. 3,988,638 and is caused by variations in the amplitude of the sawtooth if the frequency characteristic of the field output amplifier shows a peak at low frequencies. Without the measures proposed in said Patent the displayed picture oscillates in the vertical direction. If the amplitude is constant then, with a proper dimensioning one charging period of the first capacitor will indeed be shorter during synchronization than the preceding charging period but already the next charging period will be of the normal duration so that voltage $V_1$ will have the correct value. A very small disturbance is the result thereof.

The circuit according to the invention is characterized in that the input electrode of the amplifying element is connected to a d.c. voltage source whose internal resistance forms with the second capacitor a network the time constant of which is large relative to the charging time of the first capacitor.

Figure 4:
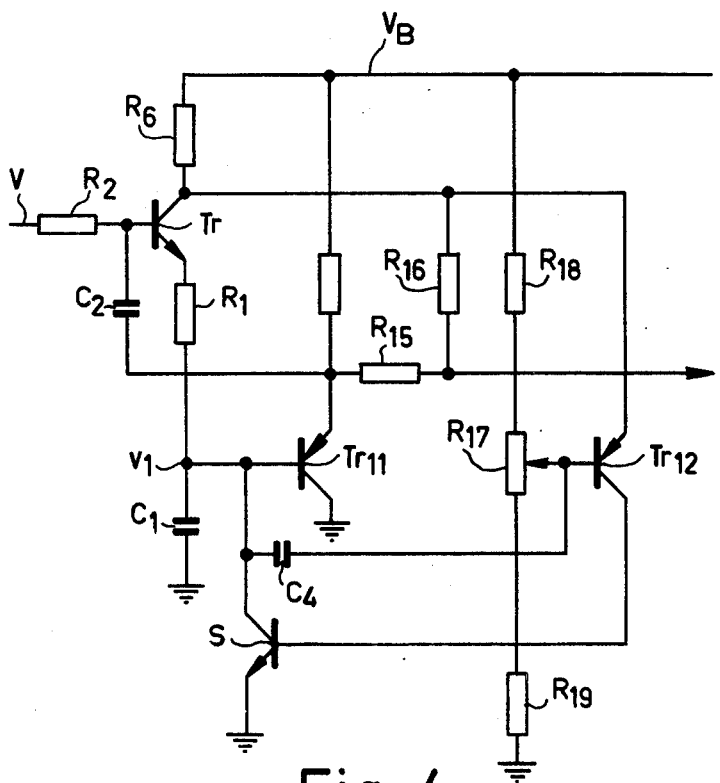
Figure 3:
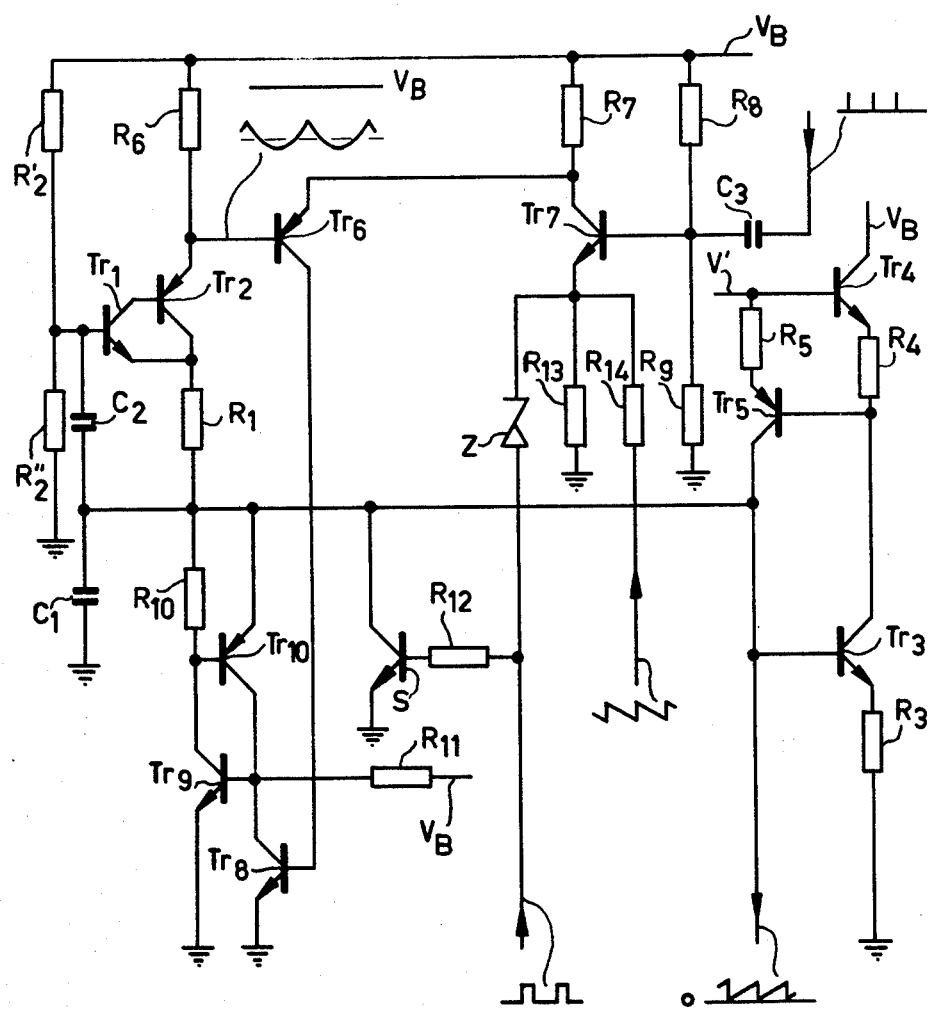

The invention will be further explained by way of non-limitative example with reference to the accompanying Figures in which:

FIG. 1 shows the prior art generator discussed above;
FIG. 2 shows a circuit diagram of the generator according to the invention, while
FIG. 3 shows a more complete diagram thereof and
FIG. 4 shows a variant of the circuit of FIG. 3.

In the circuit of FIG. 2, relative to that of FIG. 1 diode D is replaced by a resistor $R_2$ while emitter resistor R now has the symbol $R_1$. Resistor $R_2$ has a high value, in any case much higher than the parallel arrangement of resistors R' and R" which in the prior art circuit of FIG. 1 determine voltage V by means of voltage division and which, on the contrary, have rather low values so that the voltage V and, consequently, voltage $V_2$ remain constant.

No direct current can flow through capacitor $C_2$. If the base current of transistor Tr is neglected which means that the current gain of the transistor is assumed to be very high then it can be assumed that substantially no direct current flows through resistor $R_2$. The average value of the voltage at the base is, consequently, equal to V and the average value of the voltage at the emitter is V-$v_{be}$. If the value of resistor $R_1$ and the capacitance of capacitor $C_1$ are chosen so that the voltage drop caused by current $i_e$ across resistor $R_1$ is contrary to FIG. 1 negligibly small relative to voltage V and if the variation of voltage $V_{be}$ is also assumed to be very small then the average value of the voltage $v_1$ across capacitor $C_1$ is constant and approximately equal to V. The maximum value $V_1$ of voltage $v_1$ is twice as high, i.e. approximately 2V as the minimum value hereof is zero owing to the operation of switch S so that also $V_1$ is constant. Because $V_1$ is approximately equal to 2V, voltage V must be smaller than half $V_B$. If not, transistor Tr becomes saturated at the end of the charging period. It can be recognized that the charging current of capacitor $C_1$ is not constant but approximately proportional to the frequency. This is shown in FIG. 2 by means of dashed lines from which it appears clearly that the slope of the sawtooth, which is a measure of said current becomes steeper in proportion as the frequency increases while amplitude $V_1$ remains unchanged. The above-mentioned condition that voltage drop $i_e R_1$ is small implies that the time constant $R_1 C_1$ is small relative to time T.

Expressed more accurately than above the average value of voltage $v_1$ is equal to $V-v_{be}-i_e R_1$, so that $V_1 = 2(V-v_{be}-i_e R_1)$. If for the voltage drop $i_e R_1$ across resistor $R_1$ a value is chosen which is only 1% of voltage V then $V_1 = 2 (0.99 V - v_{be})$. If now the frequency with which switch S opens and closes is increased by, for example, 10% which means that the number of discharges of capacitor $C_1$ per unit of time increases by 10% then current $i_e$ and, consequently, voltage drop $i_e R_1$ also increases by 10%: so $i_e R_1$ becomes $1.1 \times 0.01 V = 0.011 V$. Amplitude $V_1$ becomes $2(0.989 V - v_{be})$. From this it appears that increasing the frequency by 10% only results in a decrease of approximately 1 per thousand in the amplitude of the output voltage.

In actual practice this reduction will be slightly larger because the current gain of transistor Tr is not infinitely large. Consequently, across resistor $R_2$ there is yet a d.c. voltage which is higher in proportion as the frequency is higher. For this reason transistor Tr may be replaced by a so-called Darlington pair or by an amplifier combination of two transistors $Tr_1$ and $Tr_2$, the collector of Tr controlling the base of $Tr_2$. Herein the current gain factor is a product of the individual factors so that a value of 3000 or more can be achieved. In FIG. 3 transistors $Tr_1$ and $Tr_2$ are of the complementary conductivity types. As known, the emitter of transistor $Tr_2$ herein functions as the collector of the combination. In this manner it is ensured that the amplitude is substantially independent of the frequency which cannot be accomplished by reducing the base current of transistor Tr in FIG. 1, as this current is determined by current $i_1$ and consequently by $V_1$ and by f.

Source V can be dispensed with because two resistors $R'_2$ and $R''_2$ are arranged in series between both the terminals of source $V_B$. The parallel arrangement hereof has the value $R_2$ and the junction point hereof is connected to the base of transistor $Tr_1$. The values of resistors $R'_2$ and $R''_2$ are chosen so that the average value of the voltage at said junction point is equal to voltage V. As it must be possible for an a.c. voltage to be present at the base of transistor $Tr_1$ said junction point is not decoupled, this in contradistinction with the circuit of FIG. 1 in which the junction point of resistors R' and R" must indeed be decoupled so that voltage V remains constant, which is also ensured by the fact that both resistors have comparatively low values. It is evident that the network $R'_2$, $R''_2$ is equivalent to a resistor of high value which would be connected between the base of transistor $Tr_1$ and the junction point of two resistors of comparatively low values, which junction point would be decoupled.

From the circuit diagram of FIG. 2 it appears that the alternating current which flows through resistor $R_2$ also flows through capacitor $C_2$ and produces a parabolic voltage across it. For, this current is, just like the a.c. voltage across resistor $R_2$, sawtooth shaped. A condition for this is that capacitor $C_2$ has a capacitance which is not infinitely large. The parabolic voltage is added to the voltage present across capacitor $C_2$ and that in such a way that the sum in the middle of the cycle is enlarged. As current $i_e$ and, consequently, the slope of voltage $v_1$ are determined by this sum, it follows that voltage $v_1$ varies in a steeper manner in the middle of the cycle than at the beginning and the end thereof. So it has the S-shape required for the deflection. It is evident that the proper form is determined by the value of resistor $R_2$ and, consequently, by that of resistors $R'_2$ and $R''_2$ in FIG. 3 and by the capacitance of capacitor $C_2$: the time constant $R_2 C_2$ must be large relative to time T.

However, the above-mentioned sawtooth-shaped current which flows through capacitor $C_2$ produces a parabolic voltage across capacitor $C_1$ which is unwanted as it is added to voltage $v_1$, the sum thus obtained having a larger steepness at the beginning of the cycle than after it. The linearity error caused in this manner can be reduced by giving resistor $R_2$ such a high value that the time constant of the network constituted by $R_2$ and the series arrangement of capacitors $C_1$ and $C_2$ is very large relative to time T. As a consequence the sawtooth-shaped current through resistor $R_2$ is kept low. In addition the error can be corrected in the manner shown in FIG. 3.

The node of components $C_1$, $C_2$, and $R_1$ is connected to the base of a transistor $Tr_3$ whose emitter is connected through a resistor $R_3$ to chassis and the collector through a resistor $R_4$ to the emitter of a further transistor $Tr_4$. The collector of transistor $Tr_4$ is connected to the positive terminal of source $V_B$ while the base thereof is connected to a voltage V' which is lower than voltage $V_B$. The base of a transistor $Tr_5$ is connected to the collector of transistor $Tr_3$ while its collector is connected to the base of that same transistor $Tr_3$ and its emitter through a resistor $R_5$ to the source of voltage V'. Resistors $R_4$ and $R_5$, transistor $Tr_5$ and the base-emitter diode of transistor $Tr_4$ constitute a so-called current mirror, wherein the collector current of transistor $Tr_5$ is equal to that of transistor $Tr_3$ if resistors $R_4$ and $R_5$ have the same values.

As the sawtooth component of voltage $v_1$ during the charging period is an increasing function of the time also the emitter current of transistor $Tr_3$, and consequently, also the collector current of transistor $Tr_5$ has a rising sawtooth-shaped variation. In contradistinction therewith the variation of the sawtooth-shaped current through capacitor $C_2$ is falling. FIG. 2 shows that the sawtooth-shaped voltage difference between the base of transistor Tr and the connection of resistor $R_2$ which is shown on the left in the drawing, is falling. Both the said currents flow through capacitor $C_1$ and eliminate each other there provided resistors $R_2$ and $R_3$ are of the same value. If the value of resistor $R_3$ is adjustable around the value of resistor $R_2$ then a parabolic component of one or the other polarity can be added to voltage $V_1$ so that the linearity of the output signal available across capacitor $C_1$ is adjustable. It is true that the amplitude of this signal depends on the value of the added parabolic component but in practice this fact causes few difficulties because the required linearity correction is only slight. Because the amplifier which amplifies the output signal of the circuit of FIG. 3 behaves as a high-pass filter overcompensation may be desired. An advantage of the described compensation circuit is that the capacitance of capacitor $C_1$ now has a non-critical value.

Switch S may be designed as a transistor which is periodically rendered conductive by the synchronizing pulses. It may, however, be desired to make the circuit selfoscillating so that an output signal is available also in the absence of these pulses. Such a modification of the circuit is also shown in FIG. 3.

A resistor $R_6$ has been included in the collector lead of the combination constituted by transistors $Tr_1$ and $Tr_2$. The voltage drop across this resistor is the sum of the d.c. voltage which is proportional to the frequency, and a parabolic voltage whose amplitude, just like that of the voltage with the same shape across capacitor $C_2$ is inversely proportional to the frequency. FIG. 3 shows the variation of the collector voltage of the combination $Tr_1$, $Tr_2$. Herein the discharging time of capacitor $C_1$ is assumed to be infinitely short so that said variation is then peak-shaped instead of parabolic. As the amplitude of the parabola is small relative to the d.c. voltage and because the frequency variation to be expected is small, namely approximately 10%, between the synchronized and the non-synchronized state in the case of a field oscillator, the difference between the dotted d.c. voltage level and that of the peaks can be neglected and said last level can be chosen for introducing the oscillation.

The collector of the combination $Tr_1$, $Tr_2$ is connected to the base of a pnp-transistor $Tr_6$ whose emitter is connected to the collector of an npn-transistor $Tr_7$. The base hereof is supplied via a capacitor $C_3$ with the positive-going synchronizing pulses and is biased by means of a voltage divider $R_8$, $R_9$ while the collector of transistor $Tr_7$ is connected to a resistor $R_7$ whose other end is connected to source $V_B$. The collector of transistor $Tr_6$ is connected to the base of a transistor $Tr_8$ whose collector is connected to the cathode gate of a thyristor which is formed by two transistors $Tr_9$ and $Tr_{10}$ of complementary conductivity types. This cathode gate is constituted by the interconnected base of transistor $Tr_9$ and collector of transistor $Tr_{10}$. The cathode of the thyristor, i.e. the emitter of transistor $Tr_9$ as well as the emitter of transistor $Tr_8$ are connected to chassis, whereas the anode, i.e. the emitter of transistor $Tr_{10}$ is connected directly and the anode gate, i.e. the interconnected collector of transistor $Tr_9$ and base of transistor $Tr_{10}$ via a separating resistor $R_{10}$ to the node of components $R_1$, $C_1$ and $C_2$.

The base bias voltage of transistor $Tr_7$ is adjusted by the choice of resistors $R_8$ and $R_9$ in such a way that in the absence of synchronizing pulses the collector voltage of transistor $Tr_7$ has a value at which transistor $Tr_6$ is conducting if its base voltage is lower than the peaks of the parabola. During the charging period of capacitor $C_1$ transistor $Tr_8$ is driven to saturation and thyristor $Tr_9$, $Tr_{10}$ is rendered non-conducting. A resistor $R_{11}$ is connected between the collector of transistor $Tr_8$ and source $V_B$. Consequently the collector current of transistor $Tr_8$ flows through resistor $R_{11}$.

As soon as, however, the collector voltage of transistor combination $Tr_1$, $Tr_2$ assumes its maximum value at the end of the charging period transistor $Tr_6$ is rendered non-conducting. Transistor $Tr_8$ is also rendered non-conducting so that the current through resistor $R_{11}$ now flows to the cathode gate of thyristor $Tr_9$, $Tr_{10}$. As a result the thyristor is conducting and the discharge of capacitor $C_1$ is introduced. Through a resistor $R_{12}$ the base of switch S is supplied with retrace pulses which are derived from the output amplifier (not shown in the drawing) which pulses are of a longer duration than those required to fully discharge capacitor $C_1$. This ensures a proper interlacing.

By designing voltage divider $R_8$, $R_9$ as a potentiometer or by designing the emitter resistor $R_{13}$ of transistor $Tr_7$ as a variable resistor the cut-off level of transistor $Tr_6$ and, consequently, the frequency can be adjusted.

If the synchronizing pulses are present at the base of transistor $Tr_7$ then they are amplified by the transistor. During the occurrence of these pulses the emitter voltage of transistor $Tr_6$ decreases which introduces the discharge of capacitor $C_1$ in the manner already described.

The sawtooth voltage generated by the circuit across capacitor $C_1$ is supplied to the output amplifier mentioned above. A resistor $R_{14}$ is included between a point hereof at which, during the trace period of the field deflection a decreasing voltage is present and the emitter of transistor $Tr_7$. Hereby it is accomplished that the emitter voltage of transistor $Tr_7$ increases immediately after the occurrence of the synchronizing pulses. The collector voltage then increases also. As a consequence transistor $Tr_6$ is firmly kept conducting which renders the circuit insensitive to interferences occurring after the retrace period and during the largest portion of the trace period. For, this measure ensures that transistor $Tr_6$ is only cut-off during the occurrence of the pulses.

If no great store is set by self-oscillating of the circuit, for example because the circuit itself is controlled by an oscillator which supplies a signal also in the absence of synchronizing pulses, then the base and the emitter of transistor $Tr_7$ can be interconnectred while resistors $R_8$, $R_9$ and $R_{13}$ are omitted. Through a zener diode Z and resistor $R_{12}$ the synchronizing and oscillator signal respectively reach the base of switch S.

In a practical embodiment of the circuit of FIG. 3 the following values were chosen:

$R_1$: 390 Ω
$R_2'$: 2.2 MΩ
$R_2''$: 3.3 MΩ
$R_3$: 1.2 MΩ
$R_4$ and $R_5$: 5.6 kΩ
$R_6$ and $R_7$: 5.6 kΩ
$R_8$ and $R_9$: 5.6 kΩ
$R_{10}$: 18 kΩ
$R_{11}$: 10 kΩ
$R_{12}$: 3.3 kΩ
$R_{13}$: 22 kΩ
$R_{14}$: 47 kΩ
$V_B$: 20 volts
$i_e$: 0.25 mA
$C_1$: 680 nF
$C_2$: 330 nF In view of the large number of components of the circuit discussed and of the output amplifier the whole assembly, capacitors $C_1$ and $C_2$ and the high-value resistors excepted, can be advantageously integrated in a semiconductor body. A plurality of temperature stabilizing components are then added in known manner.

If the circuit is designed by means of discrete components then the simplified circuit of FIG. 4 can be used. Capacitor $C_2$ is not connected to the junction points of components $R_1$ and $C_1$ but to the emitter of an emitter follower-transistor $Tr_{11}$ whose base is connected to said junction point. In this manner the sawtooth current flowing through a resistor $R_2$ does not flow through capacitor $C_1$. By means of a resistor $R_{15}$ which is connected to the emitter of transistor $Tr_{11}$ and of a resistor $R_{16}$ which connects the collector of transistor $Tr_1$ to resistor $R_{15}$ an overcompensating parabolic voltage is added to the generated sawtooth voltage. So the described linearity correction circuit replaces that of FIG. 3. However, undercompensation is not possible herewith.

In the circuit of FIG. 4 the self-oscillation is effected by means of only one transistor $Tr_{12}$ of the pnp-type whose emitter is connected to the collector of transistor Tr and the collector to the base of transistor S, while its base is connected by means of a potentiometer $R_{17}$ and two resistors $R_{18}$ and $R_{19}$ to an adjustable voltage. A capacitor $C_4$ is connected between the collector of transistor S and the base of transistor $Tr_{12}$. If the parabolic voltage present at the collector of transistor Tr reaches a value determined by potentiometer $R_{17}$ then resistor $Tr_{12}$ conducts and, consequently, transistor S also. This introduces the discharging of capacitor $C_1$. The decrease in voltage $V_1$ is transferred through capacitor $C_4$ to the base of transistor $Tr_{12}$. This transistor remains conductive, so that capacitor $C_1$ is fully discharged until capacitor $C_4$ is charged, which depends on its capacitance and on the resistances in the base lead of transistor $Tr_{12}$. This determines the duration of the retrace period. The positive-going synchronizing pulses can be supplied to the collector of transistor Tr or to the base of transistor S, whereas $R_{17}$ determines the natural frequency of the oscillator.

In a practical embodiment of the circuit of FIG. 4 the following values were chosen:

$R_1$: 2.2 k$\Omega$
$R_2$: 1.2 M$\Omega$
$R_6$: 27 k$\Omega$
$R_{17}$: 10 k$\Omega$
$R_{18}$: 15 k$\Omega$
$R_{19}$: 120 k$\Omega$
$V_B$: 25 volts
V : 10.4 volts
$C_1$: 220 nF  $C_2$: 270 nF
$C_4$: 5.6 nf It will be obvious that transistor Tr and combination $Tr_1$, $Tr_2$ respectively may be replaced by another amplifier component such as, for example, a field effect transistor or an electron tube.

What is claimed is:

1. A circuit for generating a sawtooth voltage across a first capacitor which is periodically charged by a charging current from a power supply source, said circuit comprising an amplifying element having an input electrode and a first and a second output electrode, a resistor having a first end coupled to the first output electrode of the amplifying element and a second end coupled to a first end of the first capacitor, the other end of said capacitor being coupled to a first terminal of the power supply source, the second output electrode of the amplifying element being coupled to the second terminal of the power supply source, a second capacitor coupled between the input electrode of the amplifying element and the junction of the first capacitor and the resistor, a switch means coupled in parallel with the first capacitor for periodically discharging said first capacitor, a direct current voltage source coupled to said input electrode and having an internal resistance, and a network comprising the second capacitor and said internal resistance and having a time constant which is large relative to the charging time of the first capacitor.

2. A circuit as claimed in claim 1, wherein the direct current voltage drop across the resistor is small with respect to the voltage of the direct current voltage source.

3. A circuit as claimed in claim 1, a network comprising the internal resistance of the direct current voltage source and the series arrangement of the first and the second capacitors has a time constant which is large relative to the charging time of the first capacitor.

4. A circuit as claimed in claim 1, wherein the direct current voltage source comprises a series arrangement including two resistors of a high value, said arrangement being coupled between the terminals of the power supply source and having a non-decoupled junction point coupled to the input electrode of the amplifying element.

5. A circuit as claimed in claim 1, wherein the time constant of the network comprising the resistor and the first capacitor is small relative to the charging time of the first capacitor.

6. A circuit as claimed in claim 1, further comprising a transistor having an output electrode means for supplying a sawtooth output current coupled to the junction point of the resistor and the first capacitor.

7. A circuit as claimed in claim 6, further comprising a second transistor having a base coupled to said junction point, an emitter coupled to a further resistor, the output current of the first transistor being substantially equal to the emitter current of the second transistor.

8. A circuit as claimed in claim 1, further comprising an emitter follower-transistor having a base-emitter path coupled between the junction point of the resistor and the first capacitor and the end of the second capacitor which is not connected to the input electrode of the amplifier element.

9. A circuit as claimed in claim 8, further comprising a resistor coupled between the second output electrode of the amplifier element and the second terminal of the power supply source, said two recited resistors being in series between the second output electrode and the emitter of the emitter follower-transistor.

10. A circuit as claimed in claim 1, further comprising a resistor coupled between the second output electrode of the amplifier element and the second terminal of the power supply source, a third transistor having a base coupled to said second output electrode, and a collector, and an active semiconductor element means for discharging the first capacitor coupled to said collector.

11. A circuit as claimed in claim 10, further comprising a fourth transistor having a collector coupled to the third transistor emitter, and an adjustable direct current bias, synchronizing pulses being supplyable to said fourth transistor.

12. A circuit as claimed in claim 11, wherein a sawtooth voltage with a blocking polarity is supplyable to the fourth transistor.

13. A circuit as claimed in claim 1 further comprising a resistor coupled between the second output electrode of the amplifying element and the second terminal of the power supply source, a fifth transistor having an emitter coupled to said second output electrode, and a collector, the switch means comprising a sixth transistor having a base coupled to said fifth transistor collector, the collector-emitter path of the sixth transistor being in parallel with the first capacitor, the sixth transistor collector being coupled through a capacitor to the base of the fifth transistor.

* * * * *